(12) United States Patent
Siotis

(10) Patent No.: US 8,306,238 B2
(45) Date of Patent: Nov. 6, 2012

(54) METHOD AND CIRCUIT FOR CONTROLLING AN OUTPUT OF AN AUDIO SIGNAL OF A BATTERY-POWERED DEVICE

(75) Inventor: Georg Siotis, Lund (SE)

(73) Assignee: Sony Ericsson Mobile Communications AB, Lund (SE)

( * ) Notice: Subject to any disclaimer, the term of this patent is extended or adjusted under 35 U.S.C. 154(b) by 522 days.

(21) Appl. No.: 12/486,270

(22) Filed: Jun. 17, 2009

(65) Prior Publication Data

US 2010/0322438 A1     Dec. 23, 2010

(51) Int. Cl.
- H04B 3/00 (2006.01)
- H03G 3/00 (2006.01)
- H04R 1/10 (2006.01)
- H04M 1/00 (2006.01)

(52) U.S. Cl. ............ 381/77; 381/107; 381/74; 455/572; 455/573; 455/574

(58) Field of Classification Search ............ 381/98, 381/104–107, 74, 71.6, 94.5, 370, 77; 455/572, 455/573, 574.1
See application file for complete search history.

(56) References Cited

U.S. PATENT DOCUMENTS

| | | | |
|---|---|---|---|
| 6,108,426 A * | 8/2000 | Stortz | 381/77 |
| 2002/0001381 A1 | 1/2002 | Mori | |
| 2002/0059008 A1 * | 5/2002 | Wood | 700/94 |
| 2004/0091123 A1 | 5/2004 | Stark et al. | |
| 2004/0151336 A1 * | 8/2004 | Han et al. | 381/370 |
| 2006/0256864 A1 | 11/2006 | Ju | |
| 2007/0098188 A1 * | 5/2007 | Felder | 381/107 |
| 2007/0274245 A1 | 11/2007 | Balatsos et al. | |
| 2008/0130917 A1 * | 6/2008 | Kong et al. | 381/107 |

FOREIGN PATENT DOCUMENTS

| | | |
|---|---|---|
| WO | 2004/047450 | 6/2004 |
| WO | 2008/011447 | 1/2008 |

* cited by examiner

Primary Examiner — Yuwen Pan
Assistant Examiner — George Monikang
(74) Attorney, Agent, or Firm — Peter F. Corless; Steven M. Jensen; Edwards Wildman Palmer LLP

(57) ABSTRACT

A method and a control circuit for controlling an output of an audio signal of a battery-powered device are described.

20 Claims, 5 Drawing Sheets

METHOD AND CIRCUIT FOR CONTROLLING AN OUTPUT OF AN AUDIO SIGNAL OF A BATTERY-POWERED DEVICE

BACKGROUND OF THE INVENTION

The present invention relates to methods and control circuits for controlling an output of an audio signal of a battery-powered device.

BRIEF SUMMARY OF THE INVENTION

According to an embodiment of the present invention, a method for controlling an output of an audio signal of a battery-powered device is provided. According to this embodiment, a charge condition of a battery of the battery-powered device is detected and a filtering of the audio signal is adjusted in response to the detected charge condition of the battery.

In the field of battery-powered devices, especially mobile devices like for example mobile phones, mobile personal digital assistants, mobile audio playback devices, like MP3 players, and mobile computers, audio signals are output via earphones or loudspeakers. The audio signals may comprise for example music, which is stored in the mobile device or received by the mobile device. Furthermore, the audio signals may comprise ring tones of a mobile phone or speech received via a cellular network by the mobile phone. Especially, when music is played back via loudspeakers which may be integrated into the mobile device, the power consumed by an amplifier amplifying the audio signal for the loudspeakers will be considerable. An output of audio signals or sound files through the loudspeakers of the mobile device is also called "far field playback" which consumes much more electrical power than an output of the audio signal via an earphone connected to the mobile device. A typical figure for the power consumption of a mobile phone that uses for example two loudspeakers with 8Ω each and assuming that music material consisting mainly of hard-compressed modern pop music is output, is approximately $(1.7V^2/8Ω)*2=0.72$ W. This assumes a 1.7V RMS mean value of the output signal which is a quite relevant value when taking into account that mobile phones are for example capable of up to 6.8V peak-to-peak, giving a maximum rating of 2.4V RMS. With a battery of the mobile phone having for example a capacity of 0.96 Ah at 3.6V, a playing time of approximately 4.8 hours is achievable. This lowers the standby and talk times of the mobile phone considerably. The proposed method, as described according to an embodiment above, allows by appropriate filtering the audio signal to save battery energy of 30% or even more.

According to an embodiment, the filtering is adjusted such that the lower the charge condition of the battery is, the higher the attenuation of lower frequencies of the audio signal is adjusted. The range of the lower frequencies attenuated depends on the loudspeaker used. For a typically used loudspeaker in a mobile device, like a mobile phone, these lower frequencies are in the range of 0 to 800 Hz. However, this range may be varied with the size of the speaker. For smaller speakers the lower frequencies may be in the range of 0 to 1000 Hz, and for larger speakers the lower frequencies may be in the range of 0 to 400 or 600 Hz. The attenuation of the lower frequencies may be selected in a range of 2 to 14 dB depending on the charge condition of the battery. By adjusting the filtering, especially by attenuating the lower frequencies, in response to the charge condition of the battery a large battery energy saving can be accomplished, while there is no reduction in quality of the output audio signal with a full battery and only a small reduction in quality when the battery becomes empty.

According to an embodiment, at least three different charge condition ranges are defined for the battery charge condition, and three different filtering settings are defined. Each of the three different filtering settings is associated with a different one of the three charge condition ranges. The current charge condition of the battery is compared with the at least three charge condition ranges and it is detected to which charge condition range of the at least three charge condition ranges the current charge condition of the battery corresponds. The filtering is adjusted according to the at least one of the three filtering settings that corresponds to the detected charge condition range. By providing a certain number of filtering settings each being associated with a certain charge condition range of the battery, an implementation of the method may be simplified. The filtering settings may be stored in separate data files for configuring a filter of the battery-powered device and a software-based routine may monitor the battery voltage and decide which filtering setting is to be applied to the filter.

According to another embodiment of the method, it is detected whether the audio signal is output via a loudspeaker or an earphone. Depending on the detection whether the output signal is output via the loudspeaker or the earphone, the filtering is adjusted. As the loudspeaker may have a different characteristic than the earphone, the filtering has to be adjusted accordingly. Furthermore, a filtering of the audio signal in response to the detected charge condition of the battery is only affecting the energy consumption considerably when the audio signal is output via the loudspeaker. When the audio signal is output via the earphone, a filtering of the audio signal in response to the detected charge condition of the battery may not be necessary, as the power consumption of an amplifier supplying the earphone consumes much less energy than the amplifier supplying the loudspeaker.

According to another embodiment, the method further comprises an adjusting of a dynamic range compression for the audio signal in response to the detected charge condition of a battery. When a compressor for a dynamic range compression is used in combination with a filter for filtering the audio signal, it may happen that, if the lower frequencies are attenuated to save power, the compressor will see that the medium and high frequencies will be amplified accordingly, reducing the benefits of the lowering of the lower frequencies. This may especially happen if the compressor lies after the filter. Therefore, an appropriate adjusting of the dynamic range compression in response to the detected charge condition of the battery and thus in response to the adjusted filtering of the audio signal enables the desired battery energy savings.

According to another embodiment of the present invention, a method for controlling an output of an audio signal of a battery-powered device is provided. The method comprises the following steps. A charge condition of a battery of the battery-powered device is detected. In response to the detected charge condition of the battery, a dynamic range compression of the audio signal is adjusted. In general, the dynamic range compression may comprise a gain reduction for higher levels of the audio signal. Adjusting the dynamic range compression may be accomplished in such a way that the gain reduction for higher levels of the audio signal is reduced when the charge condition of the battery is falling. Additionally, a filtering of the audio signal in response to the detected charge condition of the battery may be adjusted. As described above, especially the combination of adjusting the dynamic range compression and the filtering of the audio signal in response to the detected charge condition of the battery provides a saving of battery energy without affecting the audio quality of the output audio signal significantly.

According to an embodiment, at least three different charge condition ranges may be defined for the battery and at least three different dynamic range compression settings may be defined. Each of the at least three dynamic range compression settings is associated with a different one of the at least three charge condition ranges. According to this embodiment, it is determined to which charge condition range of the at least three charge condition ranges the current charge condition of the battery corresponds. The dynamic range compression is then set according to the one of the at least three dynamic range compression settings that corresponds to the detected charge condition range.

According to another embodiment of the method, the method further comprises a detection, whether the audio signal is output via a loudspeaker or an earphone. Based on the detection whether the audio signal is output via the loudspeaker or the earphone, the dynamic range compression is additionally adjusted. This embodiment enables an optimum adjustment of the dynamic range compression to the individual characteristics of the loudspeaker and the earphone, respectively.

According to another embodiment of the present invention, a control circuit for controlling an output of an audio signal of a battery-powered device is provided. The control circuit comprises a battery input for detecting a charge condition of a battery of the battery-powered device, and a filter control output for controlling an audio filter for filtering the audio signal. The control circuit is adapted to control the audio filter in response to the detected charge condition of the battery.

The control circuit may be adapted to adjust the audio filter such that the lower the charge condition of the battery is, the higher the attenuation of lower frequencies of the audio signal is. The lower frequencies may define a range of 0 to 800 Hz.

According to an embodiment, for example, in a software of the control circuit at least three different charge condition ranges for the battery are defined and at least three different settings for the audio filter are defined. Each of the at least three audio filter settings is associated with a different one of the at least three charge condition ranges. The control circuit is adapted to detect to which charge condition range the current charge condition of the battery corresponds, and to supply the audio filter with that audio filter setting that corresponds to the detected charge condition range.

The control circuit may further comprise an input for detecting whether the audio signal is output via a loudspeaker or an earphone. The control circuit may be adapted to control the audio filter additionally in response to this detection.

According to another embodiment, the control circuit further comprises a compressor control output for controlling a compressor. The compressor may be configured to adjust a dynamic range compression for the audio signal. The control circuit controls the compressor based on the detected charge condition of the battery.

According to yet another embodiment of the present invention, a control circuit for controlling an output of an audio signal of a battery-powered device is provided. The control circuit comprises a battery input for detecting a charge condition of a battery of the battery-powered device, and a compressor control output for controlling a compressor for adjusting a dynamic range compression of the audio signal. The control circuit controls the compressor in response to the detected charge condition of the battery.

The dynamic range compression of the compressor may comprise a gain reduction for higher levels of the audio signal. The compressor is controlled by the control circuit in such a way that the gain reduction for higher levels of the audio signal is reduced when the charge condition of the battery decreases. As an alternative, the dynamic range compression of the compressor may comprise a gain enhancement for lower levels of the audio signal. In this case, the control circuit is adapted to control the compressor in such a way that the lower the charge condition of the battery is the lower the gain enhancement for lower levels of the audio signal is.

According to an embodiment, in the control circuit at least three different charge condition ranges are defined for the battery, and at least three different dynamic range compression settings are defined for the compressor. Each of the at least three dynamic range compression settings is associated with a different one of the at least three charge condition ranges. The control circuit is adapted to detect to which charge condition range of the at least three charge condition ranges the current charge condition of the battery corresponds, and to set in the compressor that setting of the at least three dynamic range control settings that corresponds to the detected charge condition range.

The control circuit may furthermore comprise an input for detecting whether the audio signal is output via a loudspeaker or an earphone. The control circuit may control the compressor additionally in response to this detection, which determines whether the audio signal is output via the loudspeaker or the earphone.

According to an embodiment, the control circuit comprises furthermore a filter control output for controlling an audio filter. The audio filter is adapted to filter the audio signal. The control circuit controls the audio filter in response to the detected charge condition of the battery.

According to another embodiment of the present invention, a mobile device is provided. The mobile device comprises an audio signal source which is configured to provide an audio signal to be output by the mobile device. The audio signal from the audio signal source may comprise a decoded MP3 signal or any other kind of music or speech signal which is to be output by the mobile device. The mobile device comprises furthermore a battery for supplying the mobile device with energy. The mobile device comprises furthermore an audio filter configured to filter the audio signal, and a compressor configured to adjust a dynamic range compression for the audio signal. The audio filter may be adapted to adapt the audio signal to the characteristic of a loudspeaker or an earphone emitting the audio signal as an acoustic signal. The compressor may be used to control the gain and/or attenuation of the audio signal as a function of the level of the audio signal being input to the compressor. Furthermore, the mobile device comprises a control circuit with a battery input, a filter control output, and a compressor control output. The battery input is coupled to the battery for detecting a charge condition of the battery. The filter control output is coupled to the audio filter for controlling the audio filter, for example, for adjusting a filtering characteristic of the audio filter. The compressor control output is coupled to the compressor for controlling the compressor, for example, for adjusting the dynamic range compression characteristic. The control circuit is adapted to control the audio filter and the compressor in response to the detected charge condition of the battery.

The mobile device as described above provides longer operating times when putting out audio data, as the power consumption of an amplifier of the mobile device is reduced by controlling the audio filter and the compressor in response to the detected charge condition of the battery. The mobile device may be a mobile phone, a personal digital assistant, a mobile audio playback device or a mobile computer.

It is to be understood that the features of the embodiments described above may be combined with each other, where applicable.

BRIEF DESCRIPTION OF THE DRAWINGS

Hereinafter exemplary embodiments of the invention will be described with reference to the drawings.

DETAILED DESCRIPTION OF THE INVENTION

Figure 1:
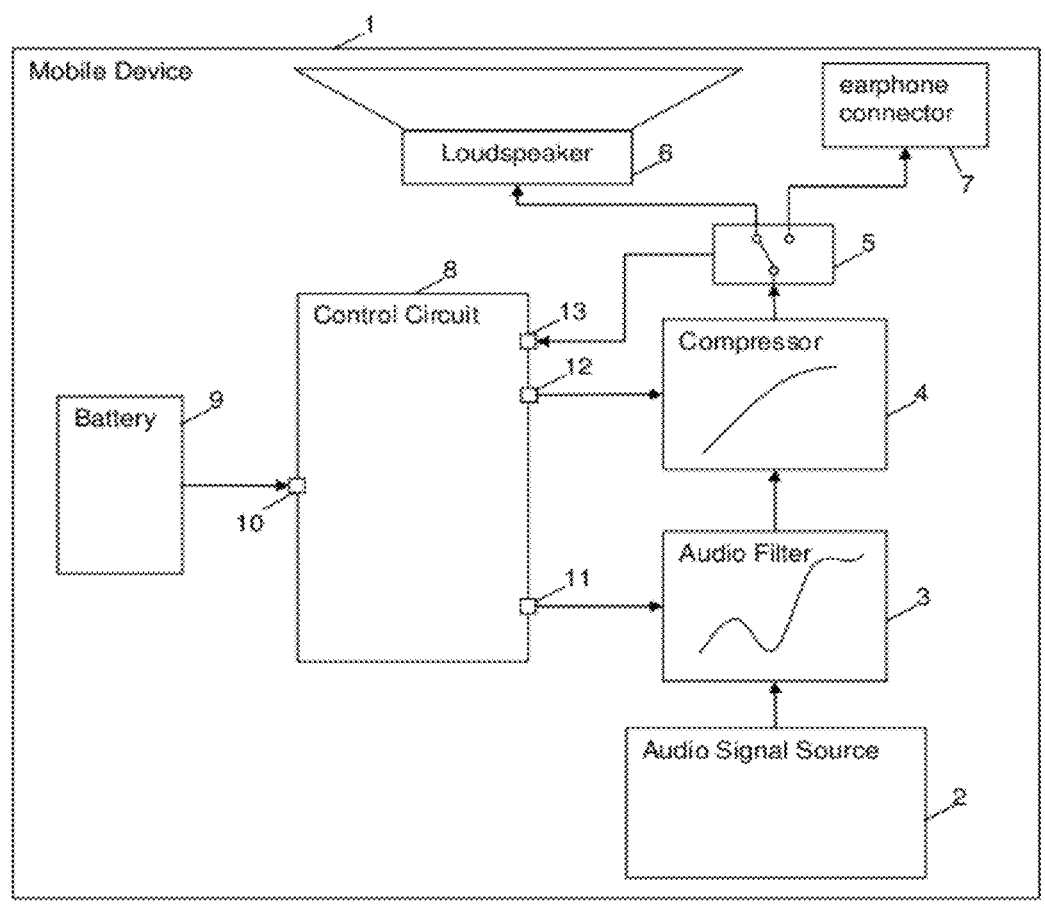
FIG. 1 shows a block diagram of a mobile device according to an embodiment of the present invention.

In the following, exemplary embodiments of the present invention will be described in detail. It is to be understood that the following description is given only for the purpose of illustrating the principles of the invention and it is not to be taken in a limiting sense. Rather, the scope of the invention is defined only by the appended claims and is not intended to be limited by the exemplary embodiments hereinafter.

It is also to be understood that in the following detailed description of the exemplary embodiments, any direct connection or coupling between functional blocks, devices, components or other physical or functional units shown in the drawings or description herein could also be implemented by an indirect connection or coupling.

It is further to be understood that the features of the various exemplary embodiments described herein may be combined with each other unless specifically noted otherwise.

FIG. 1 shows an embodiment of a mobile device 1 according to the present invention. The mobile device 1 comprises an audio signal source 2, an audio filter 3, a compressor 4, a switch 5, a loudspeaker 6, an earphone connector 7, a control unit 8, and a battery 9. The mobile device 1 may be a mobile phone comprising a functionality to output an audio signal, for example music, being played back from a (not shown) internal memory of the mobile device 1 or being received via a radio frequency by the mobile device 1. Furthermore, the mobile device 1 may be a personal digital assistant, a mobile audio playback device or a mobile computer or any other kind of battery-powered mobile device.

The audio signal from the audio signal source 2 is passed through the audio filter 3 and the compressor 4 to the switch 5. The audio filter 3 may be used to adapt the audio signal from the audio signal source 2 according to characteristics of an electro-acoustic converter, for example the loudspeaker 6 or an earphone connected to the earphone connector 7. The compressor 4 may be used to control the level of the filtered audio signal by means of a dynamic range compression. The switch 5 selectively passes the filtered and compressed audio signal to the loudspeaker 6 or to the earphone connector 7. A (not shown) earphone may be connected to the earphone connector 7. Although only one loudspeaker 6 is shown in FIG. 1, the mobile device 1 may comprise more than one loudspeaker 6, for example two loudspeakers for outputting a stereo audio signal.

The compressor 4 may also comprise an amplifier for amplifying the filtered audio signal according to the needs of the connected electro-acoustic converter, for example the loudspeaker 6 or an earphone connected to the earphone connector 7.

The control circuit 8 is connected via a battery input 10, a filter control output 11, a compressor control output 12, and an input 13 to the battery 9, the audio filter 3, the compressor 4, and the switch 5, respectively. Via the battery input 10 the control circuit 8 is coupled to the battery 9 and adapted to detected a charge condition of the battery 9. Via the filter control output 11 the control circuit 8 is coupled to the audio filter 3 and adapted to adjust a filter characteristic of the audio filter 3. The control circuit 8 may be for example a digital controller or processor comprising a memory wherein different blocks of information are stored for configuring the audio filter 3. Depending on the information block provided from the control circuit 8 to the audio filter 3, a filter characteristic of the audio filter 3 is adjusted. Via the compressor control output 12 the control unit 8 is coupled to the compressor 4. Comparable to the adjustment of the audio filter 3, the compressor 4 can be configured via the compressor control output 12. In particular, a dynamic compression control characteristic of the compressor 4 can be configured. Details of the filter characteristics and the dynamic range compression characteristics will be described in connection with FIGS. 3 to 8.

Finally, the control circuit 8 is coupled via the input 13 to the switch 4 to receive information about the current switch state of the switch 5.

Figure 2:
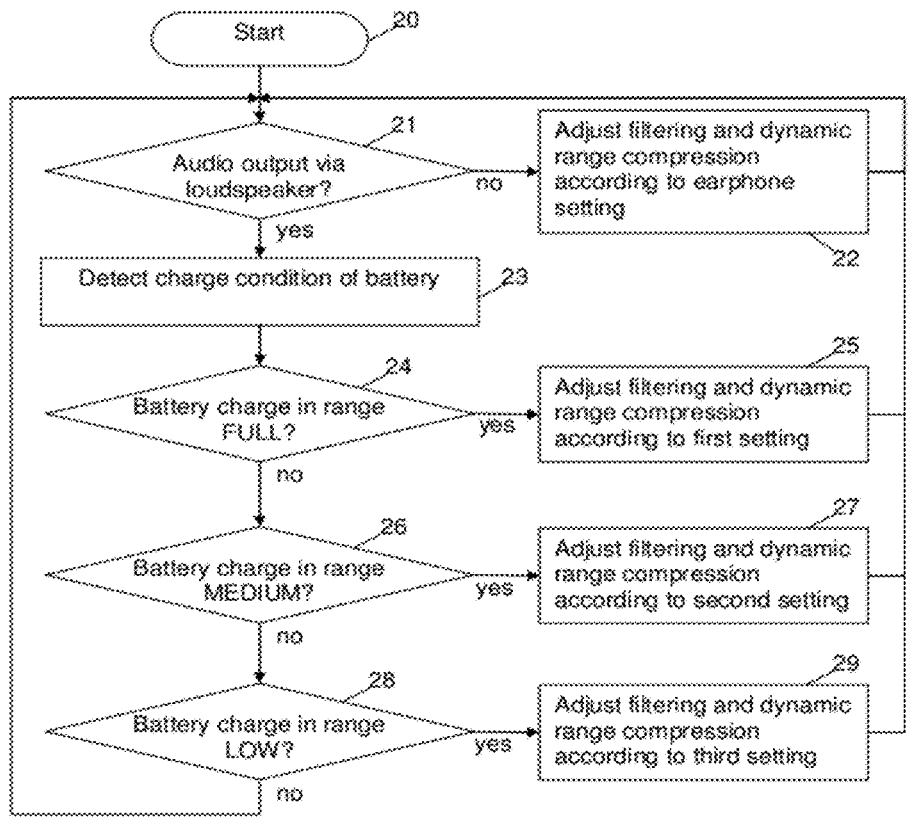
FIG. 2 shows a flow chart of a method for controlling an output of an audio signal according to an embodiment of the present invention.

FIG. 2 shows a flow chart depicting the operation of the control circuit 8 in detail according to an embodiment. The operation of the control circuit 8 starts at block 20, when for example an output of an audio signal is started at the audio signal source 2 by a user of the mobile device 1.

In block 21, the control unit 8 determines the current state of the switch 5. If the switch 5 is set to pass the audio signal from the compressor 4 to the earphone connectors 7, the audio filter 3 and the compressor 4 are configured by the control circuit 8 according to a set of audio filter and compressor configuration data, which are adapted to an earphone connected to the earphone connector 7 (block 22). If the control circuit 8 determines that the switch 5 is configured to pass the compressed and filtered audio signal to the loudspeaker 6, the control circuit 8 determines a current charge condition of the battery 9 (block 23).

According to this embodiment, there are three different charge condition ranges defined: a first charge condition range "FULL" indicates for example that the battery 9 is charged in a range of 67% to 100% of its maximum capacity. A second charge condition range "MEDIUM" indicates a charge condition of the battery 9 in the range of for example 34% to 66% of its maximum capacity. A third charge condition range "LOW" indicates a charge condition of the battery 9 in the range of 0% to 33% of its maximum capacity. The detected charge condition of the battery 9 is now compared with the three charge condition ranges FULL, MEDIUM and LOW (blocks 24, 26, 28).

Figure 3:
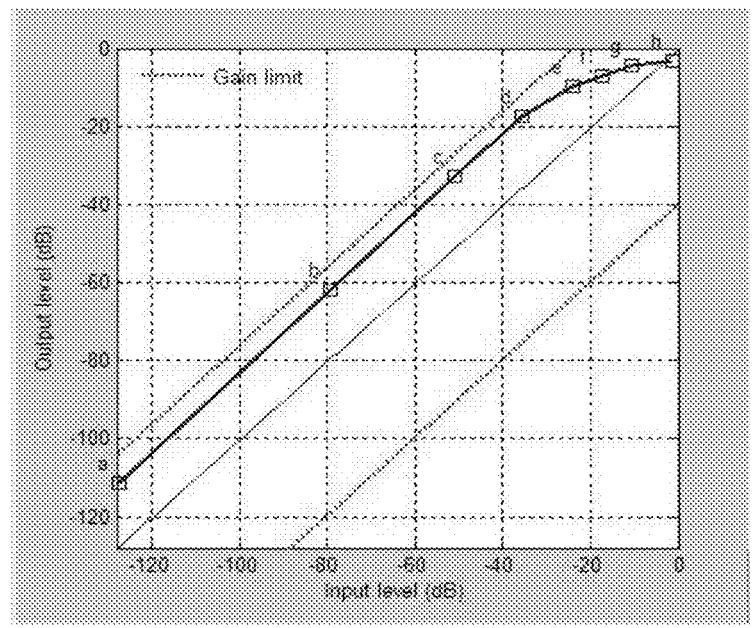
FIG. 3 shows a first dynamic range compression setting according to an embodiment of the present invention.
Figure 4:
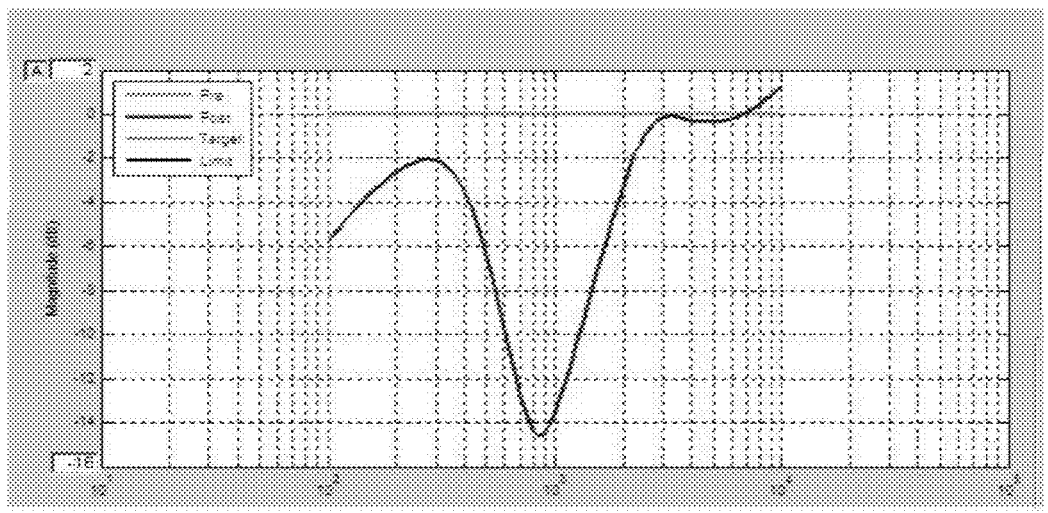
FIG. 4 shows a first audio filter setting according to an embodiment of the present invention.

If the current charge condition of the battery 9 falls in the FULL range (block 24), the dynamic range compression of the compressor 4 and the filtering of the audio filter 3 are configured by the control circuit 8 according to a first setting (block 25). FIG. 3 shows this first setting for the dynamic range compression and FIG. 4 shows this first setting for the filtering. FIG. 4 shows on the X-axis the frequency and on the Y-axis the magnitude of the attenuation of the filter setting for the audio filter 3. As can be seen from the graph in FIG. 4, in the first setting there is a filtering of the frequencies around 800 Hz, which is common when designing filters for small loudspeakers like those loudspeakers which are used in, for example, mobile phones. In FIG. 3 a graph indicating the dynamic range compression performed by the compressor 4 according to the first setting is shown. The X-axis indicates an input level of an audio signal input to the compressor 4 and the Y-axis indicates the corresponding output level of the audio signal from the compressor 4. The graph indicated by letters a, b, c, d, e, f, g, and h shows the transfer function of the compressor 4 in the first setting. As can be seen, this transfer function is non-linear, reducing higher input levels and thus emphasizing lower input levels. Such a dynamic range compression is commonly used when audio signals are output via small loudspeakers, like those used in mobile phones. After configuring the audio filter 3 and the compressor 4 according to the first setting in block 25, the method is continued at block 21 as described above.

Figure 5:
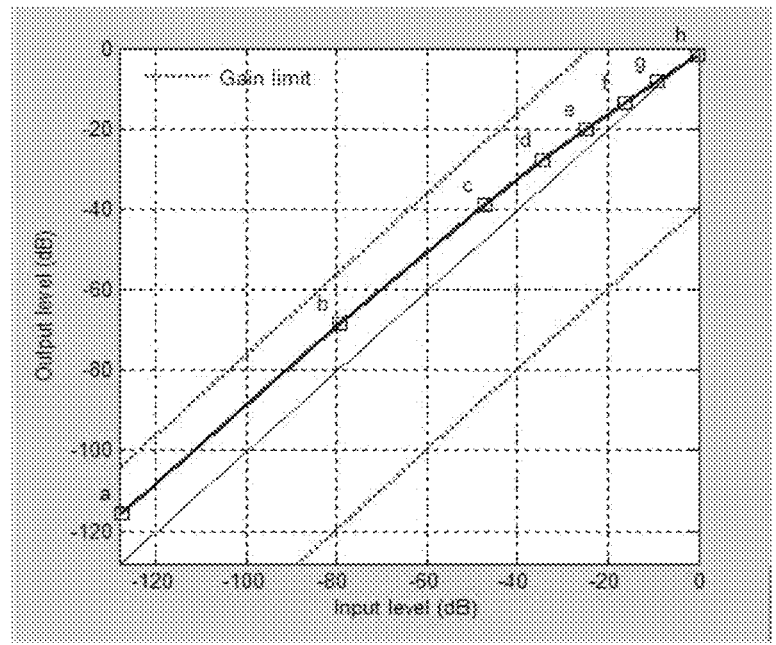
FIG. 5 shows a second dynamic range compression setting according to an embodiment of the present invention.
Figure 6:
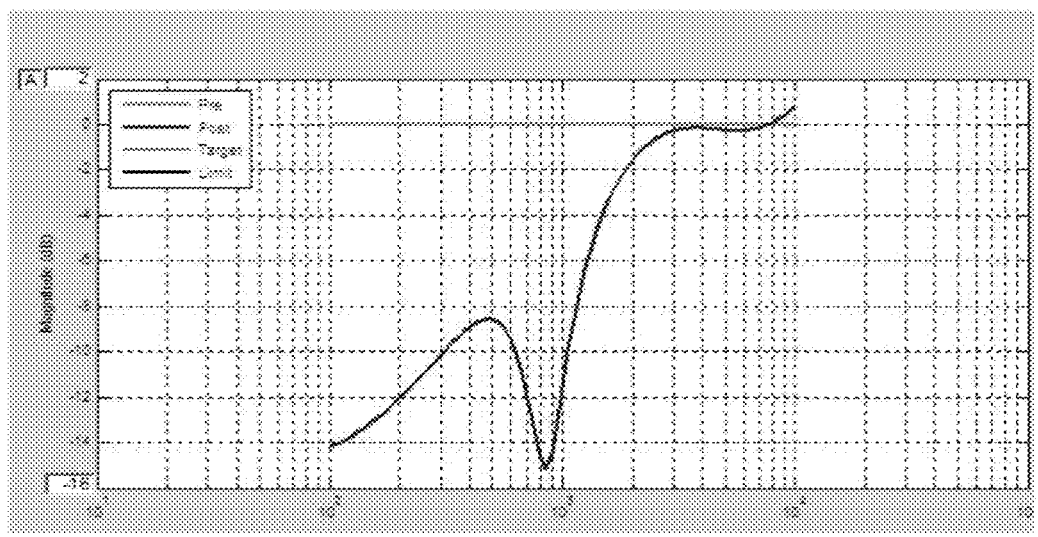
FIG. 6 shows a second audio filter setting according to an embodiment of the present invention.

In case the current charge condition of the battery 9 does not fall in the FULL range, it is tested in block 26 if the current charge condition of the battery 9 falls in the MEDIUM range. If the current battery charge condition falls in this range (for example if the battery contains currently between 34% and 66% of its maximum capacity), the audio filter 3 and the compressor 4 are configured according to a second setting, as indicated in block 27. The filtering characteristic and the transfer function of the dynamic range compression according to this second setting are shown in FIGS. 6 and 5, respectively. The filter function shown in FIG. 6 provides an attenuation or filtering of the lower frequencies in the range of approximately 100 to 800 Hz by approximately 6 dB compared with the characteristic of FIG. 4. This will result in a sound of the audio signal with less lower frequencies or less bass, but this will save a considerable amount of energy when amplifying this audio signal. FIG. 5 shows the transfer function of the dynamic range compression according to the second setting. The transfer function of FIG. 5 is indicated by the graph running through points a, b, c, d, e, f, g, and h. As can be seen, the transfer function of the second setting has become "straighter". After adjusting the filtering and the dynamic range compression according to the second setting in block 27, the method of FIG. 2 is continued with block 21 as described above.

Figure 7:
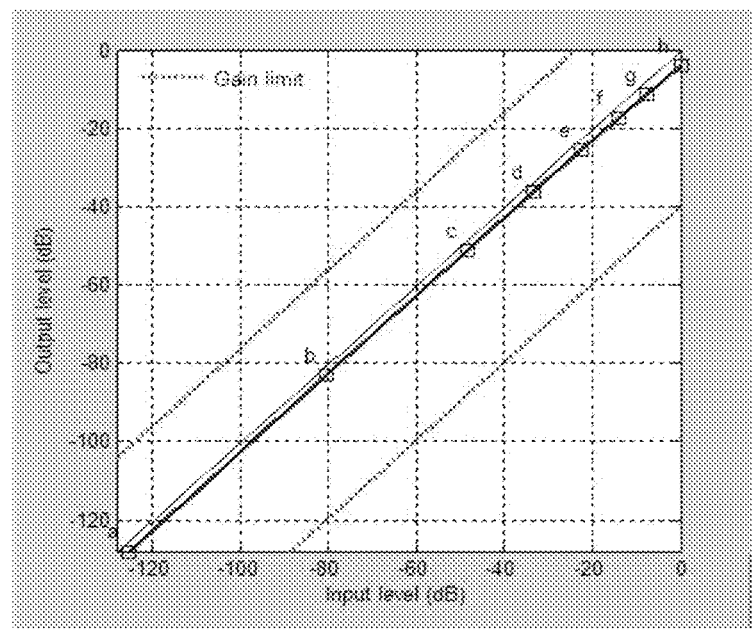
FIG. 7 shows a third dynamic range compression setting according to an embodiment of the present invention.
Figure 8:
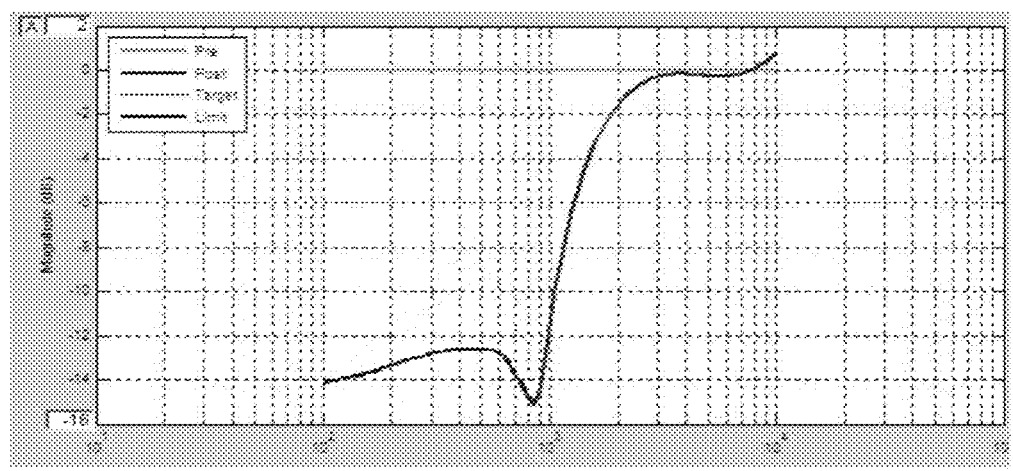
FIG. 8 shows a third audio filter setting according to an embodiment of the present invention.

If in block 26 it is determined that the current charge condition of the battery 9 does not fall in the MEDIUM range, it is determined by the control circuit 8 in block 28 if the charge condition of the battery 9 falls in the above-defined LOW range. If the current charge condition of the battery 9 falls in the LOW range, i.e. the current charge condition of the battery 9 is for example in the range of 0% to 33% of the maximum capacity of the battery 9, the audio filter 3 and the compressor 4 are adjusted according to a third setting in block 29. A filtering characteristic for the audio filter 3 and a transfer function for the compressor 4 according to the third setting are shown in FIGS. 8 and 7, respectively. As can be seen from FIG. 8, there is a stronger filtering of the lower frequencies compared with the filtering of the first and the second settings (FIGS. 4 and 6). This will result in a sound with even less bass, but will even save more energy. The transfer function of the dynamic range compression for the compressor 4 is indicated by the graph running through points a to h as shown in FIG. 7. The transfer function according to the third setting is linear, which means that there is no dynamic range compression. After setting the audio filter 3 and the compressor 4 according to the third setting in block 29, the method in FIG. 2 is continued with block 21 as described above.

If in block 28 it is detected that the current battery charge condition does not fall in the LOW range, the method is continued with block 21 as described above.

It should be noted that especially if the compressor 4 lies as indicated in FIG. 1 after the audio filter 3, and when the dynamic range compression is activated as for example shown in FIG. 3, and if the lower frequencies are attenuated to save power as for example indicated in FIG. 8, the compressor 4 will amplify the medium and high frequencies accordingly, which may reduce the benefits of energy saving of the lowering of the lower frequencies. Therefore, the transfer function of the compressor 4 is straighter in FIG. 5 and linear in FIG. 7.

The above-described method can be very easily implemented by basically using three different configuration settings for the audio filter 3 and the compressor 4. A simple software-based routine in the control circuit 8 may monitor the charge condition or the voltage of the battery 9 and decide which of the settings is to be used by the audio filter 3 and the compressor 4.

The transition from one setting to another setting could be combined with a dialogue with a user of the mobile device indicating to the user that sound settings have been changed to preserve battery life.

While exemplary embodiments have been described above, various modifications may be implemented in other embodiments. For example, the number of settings for the compressor 4 and the audio filter 3 may be different to the above-described three settings. Two different settings or even more than three different settings corresponding to a corresponding number of charge condition ranges of the battery 9 may also be used. Furthermore, two or more different frequency-based compressors 4 may be used working in tandem depending on the battery charge condition or voltage, for instance one compressor for the lower frequencies and one or two compressors for higher frequencies.

The embodiments described above with reference to the Figures may be each realized in a dedicated chip or any combination of the embodiments described above may be realized within one chip combining the functionality and characteristics of these embodiments. Furthermore, the embodiments described above may not only be used in a mobile phone, but may also be used in any other kind of battery-powered device or battery-powered mobile device containing a battery and being adapted to output an audio signal. It is also understood that all the embodiments described above are considered to be comprised by the present invention as it is defined by the appended claims.

What is claimed is:

1. A method for controlling an output of an audio signal of a battery powered device, the method comprising: detecting whether the audio signal is output via a loudspeaker or an earphone; detecting a charge condition of a battery of the battery powered device; (-cancelled) adjusting a filtering of the audio signal in response to the detected charge condition and depending on whether the audio signal is output via the loudspeaker or the earphone.

2. The method of claim 1, wherein the filtering is adjusted such that the lower the charge condition of the battery is the higher the attenuation of lower frequencies of the audio signal is.

3. The method of claim 2, wherein the lower frequencies are in the range of 0 to 800 Hz.

4. The method of claim 1, wherein at least three different charge condition ranges are defined for the battery, and at least three different filtering settings are defined, each of the at least three filtering settings being associated with a different one of the at least three charge condition ranges, the method further comprising:
 detecting to which charge condition range of the at least three charge condition ranges the current charge condition of the battery corresponds, and
 adjusting the filtering according to the one of the at least three filtering settings that corresponds to the detected charge condition range.

5. The method of claim 1, further comprising:
 adjusting a dynamic range compression for the audio signal in response to the detected charge condition of the battery.

6. A method for controlling an output of an audio signal of a battery powered device, the method comprising: detecting whether the audio signal is output via a loudspeaker or an earphone, detecting a charge condition of a battery of the battery powered device, and adjusting a dynamic range compression of the audio signal in response to the detected charge condition of the battery and depending on whether the audio signal is output via the loudspeaker or the earphone, wherein the dynamic range compression comprises a gain reduction for higher levels of the audio signal, and wherein the dynamic range compression is set such that the lower the charge condition of the battery is the lower the gain reduction for higher levels of the audio signal is.

7. The method of claim 6, wherein at least three different charge condition ranges are defined for the battery, and at least three different dynamic range compression settings are defined, each of the at least three dynamic range compression settings being associated with a different one of the at least three charge condition ranges, the method further comprising:
 detecting to which charge condition range of the at least three charge condition ranges the current charge condition of the battery corresponds, and
 adjusting the dynamic range compression according to the one of the at least three dynamic range compression settings that corresponds to the detected charge condition range.

8. The method of claim 6, further comprising:
 detecting, whether the audio signal is output via a loudspeaker or an earphone, and
 adjusting the dynamic range compression additionally in response to the detection, whether the audio signal is output via the loudspeaker or the earphone.

9. The method of claim 6, further comprising:
 adjusting a filtering of the audio signal in response to the detected charge condition of the battery.

10. A control circuit for controlling an output of an audio signal of a battery powered device, the control circuit comprising:
 a battery input for detecting a charge condition of a battery of the battery powered device;
 an input for detecting whether the audio signal is output via a loudspeaker or an earphone; and
 a filter control output for controlling an audio filter for filtering the audio signal, wherein the control circuit is configured to control the audio filter in response to the detected charge condition of the battery and depending on whether the audio signal is output via the loudspeaker or the earphone.

11. The control circuit of claim 10, wherein the control circuit is configured to adjust the audio filter such that the lower the charge condition of the battery is the higher the attenuation of lower frequencies of the audio signal is.

12. The control circuit of claim 11, wherein the lower frequencies are in the range of 0 to 800 Hz.

13. The control circuit of claim 10, wherein at least three different charge condition ranges are defined for the battery, and at least three different settings for the audio filter are defined, each of the at least three settings being associated with a different one of the at least three charge condition ranges, the control circuit being further configured:
 to detect to which charge condition range of the at least three charge condition ranges the current charge condition of the battery corresponds, and to supply to the audio filter the setting of the at least three settings that corresponds to the detected charge condition range.

14. The control circuit of claim 10, further comprising a compressor control output for controlling a compressor adjusting a dynamic range compression for the audio signal, the control circuit being further configured to control the compressor in response to the detected charge condition of the battery.

15. A control circuit for controlling an output of an audio signal of a battery powered device, the control circuit comprising: an input for detecting whether the audio signal is output via a loudspeaker or an earphone, a battery input for detecting a charge condition of a battery of the battery powered device, and a compressor control output for controlling a compressor for adjusting a dynamic range compression of the audio signal, wherein the control circuit is configured to control the compressor in response to the detected charge condition of the battery and depending on whether the audio signal is output via the loudspeaker or the earphone, and the dynamic range compression of the compressor comprises a gain reduction for higher levels of the audio signal, and wherein the control circuit is configured to control the compressor such that the lower the charge condition of the battery is the lower the gain reduction for higher levels of the audio signal is.

16. The control circuit of claim 15, wherein at least three different charge condition ranges are defined for the battery, and at least three different settings for the compressor are defined, each of the at least three settings being associated with a different one of the at least three charge condition ranges, the control circuit being further configured to:
 detect to which charge condition range of the at least three charge condition ranges the current charge condition of the battery corresponds, and
 supply to the compressor the setting of the at least three settings that corresponds to the detected charge condition range.

17. The control circuit of claim 15, further comprising an input for detecting, whether the audio signal is output via a loudspeaker or an earphone, wherein the control circuit is configured to control the compressor additionally in response to the detection, whether the audio signal is output via the loudspeaker or the earphone.

18. The control circuit of claim 15, further comprising a filter control output for controlling an audio filter for filtering the audio signal, the control circuit being further configured to control the audio filter in response to the detected charge condition of the battery.

19. A mobile device, comprising: an audio signal source configured to provide an audio signal to be output by the mobile device, a battery configured to supply the mobile device with energy, an audio filter configured to filter the audio signal, a compressor configured to adjust a dynamic range compression for the audio signal, and a control circuit comprising: an input for detecting whether the audio signal is output via a loudspeaker or an earphone; a battery input coupled to the battery for detecting a charge condition of the battery, a filter control output coupled to the audio filter for controlling the audio filter, and a compressor control output coupled to the compressor for controlling the compressor, wherein the control circuit is configured to control the audio filter and the compressor in response to the detected charge condition of the battery and depending on whether the audio signal is output via the loudspeaker or the earphone, and the dynamic range compression of the compressor comprises a gain reduction for higher levels of the audio signal, and wherein the control circuit is configured to control the compressor such that the lower the charge condition of the battery is the lower the gain reduction for higher levels of the audio signal is.

20. The mobile device according to claim 19, wherein the mobile device is a device selected from the group comprising a mobile phone, a personal digital assistant, a mobile audio playback device, and a mobile computer.

* * * * *